(12) United States Patent
Tourret

(10) Patent No.: US 9,608,599 B2
(45) Date of Patent: Mar. 28, 2017

(54) CIRCUIT FOR DETECTING PHASE SHIFT APPLIED TO AN RF SIGNAL

(71) Applicant: NXP B.V., Eindhoven (NL)

(72) Inventor: Jean-Robert Tourret, Caen (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/798,933

(22) Filed: Jul. 14, 2015

(65) Prior Publication Data

US 2016/0043703 A1    Feb. 11, 2016

(30) Foreign Application Priority Data

Aug. 7, 2014 (EP) .................................... 14290234

(51) Int. Cl.
| | | |
|---|---|---|
| *H03H 17/08* | (2006.01) | |
| *H03D 13/00* | (2006.01) | |
| *H05B 6/68* | (2006.01) | |
| *H05B 6/70* | (2006.01) | |
| *H05B 6/72* | (2006.01) | |

(52) U.S. Cl.
CPC ............ *H03H 17/08* (2013.01); *H03D 13/00* (2013.01); *H05B 6/686* (2013.01); *H05B 6/705* (2013.01); *H05B 6/72* (2013.01); *Y02B 40/143* (2013.01); *Y02B 40/146* (2013.01)

(58) Field of Classification Search
None
See application file for complete search history.

(56) References Cited

U.S. PATENT DOCUMENTS

| | | |
|---|---|---|
| 3,906,361 A | 9/1975 | Nessler et al. |
| 6,351,153 B1 | 2/2002 | Fischer |
| 2008/0265999 A1* | 10/2008 | Wan .......................... H03L 7/07 331/16 |
| 2009/0243628 A1 | 10/2009 | Andarawis |
| 2010/0134161 A1 | 6/2010 | Xu et al. |
| 2012/0103972 A1 | 5/2012 | Okajima |

FOREIGN PATENT DOCUMENTS

WO    2013/156060 A1    10/2013

OTHER PUBLICATIONS

Extended European Search Report for EP Patent Appln. No. 14290234.5 (Dec. 23, 2014).

* cited by examiner

*Primary Examiner* — Cassandra Cox

(57) ABSTRACT

An RF circuit and method for detecting the amount of phase shift applied to an RF signal. An RF heating apparatus including the RF circuit. The RF circuit includes a phase shifter operable to apply a phase shift to a reference signal to produce a phase shifted reference signal. The RF circuit also includes a phase detector operable to detect a phase difference between the phase shifted RF signal and the phase shifted reference signal. The phase detector has a reduced input range at a frequency of the phase shifted RF signal. The RF circuit further includes a controller operable to control the phase shifter to set the phase of the phase shifted reference signal so that the phase difference between the phase shifted RF signal and the phase shifted reference signal falls within the reduced input range of the phase detector.

15 Claims, 6 Drawing Sheets

CIRCUIT FOR DETECTING PHASE SHIFT APPLIED TO AN RF SIGNAL

CROSS-REFERENCE TO RELATED APPLICATIONS

This application claims the priority under 35 U.S.C. §119 of European patent application no. 14290234.5, filed on Aug. 7, 2014, the contents of which are incorporated by reference herein.

FIELD OF THE INVENTION

This invention relates to an RF circuit for detecting the amount of phase shift applied to an RF signal to produce a phase shifted RF signal in an RF signal path, and to a corresponding method. This invention also relates to an RF heating apparatus including the RF circuit. This invention further relates to a method of operating an RF heating apparatus.

BACKGROUND OF THE INVENTION

Recent improvements in the manufacture of high power solid state amplifiers have given rise to applications in new fields such as microwave cooking, ignition engine efficiency and in medical devices and treatments.

Conventionally, an RF heating apparatus such as a microwave oven generates RF power to be introduced into a cavity using the device known as a magnetron. A magnetron is an oscillator-amplifier that typically provides RF energy only at a single frequency (for example 2.5 GHz).

The efficiency of the heating provided by a microwave oven is dependent upon the proportion of the RF energy introduced into a cavity of the oven that is actually absorbed by the food or beverage being heated. Normally, at least some of the RF energy introduced into the cavity is reflected back to the magnetron, whereby the power efficiency of the heating apparatus is reduced. It is well known that the reflection of the RF energy inside the cavity depends on factors such as the wavelength, phase and amplitude of the RF radiation, the size, shape and cross section of the food or beverage, and the dimensions and shape of the cavity itself.

Accordingly, it is known that one way to optimise the amount of RF energy that is absorbed by the food or beverage being heated is to trim the physical parameters of the RF radiation, to minimise the reflected signal. These parameters include the amplitude, frequency and/or phase of the radiation. Although a magnetron is a relatively cheap component, it does not allow for this kind of trimming. On the other hand, solid state devices may be able to provide trimming since they can enable multi-frequency, multi-phase operation, with multiple paths.

FIG. 1 shows an example of an RF circuit 10 including solid state components that can be used to implement trimming of the kind noted above. The circuit 10 includes a plurality of paths A, B, C. Each path includes a phase locked loop (PLL) 2A, 2B, 2C for producing an RF signal. As shown by the dashed lines, the PLLs 2B and 2C may in some examples be disabled (or simply omitted), such that PLL 2A can be used to provide the RF signal for each path. In such examples, the PLL 2A is thus a common PLL that is shared by each path A, B, C, and each path A, B, C would typically operate at the same frequency (i.e. the operating frequency of the PLL 2A). Where separate PLLs (e.g. 2A, 2B, 2C) are provided for each path, multi-frequency operation may be enabled.

An output of each PLL 2A, 2B, 2C (or, as noted above, the output of a common or shared PLL 2A) is connected to phase shifters 4A, 4B, 4C. The phase shifters 4A, 4B and 4C can be used to apply the phase shifts to the RF signal of each path under the control of a microcontroller 14. Accordingly, the microcontroller 14 may adjust the phase of each path for trimming the RF radiation produced by the system. Note that the micro-controller may also control the PLLs 2A, 2B, 2C to adjust the frequency of the RF signal in each path A, B, C.

The phase shifted signals are then provided to variable gain amplifiers 6A, 6B, 6C and then to power amplifiers 8A, 8B, 8C for subsequent introduction of RF radiation into the cavity of the heating apparatus by respective antennae 12A, 12B, 12C.

When each path works at the same operating frequency, it is important for the phase between the paths to be accurate and not time varying. Typically, this property can only be achieved if one of the paths provides a phase reference (e.g. a reference signal used by PLL 2A) to each of the other paths so that it is possible to provide phase coherent signals to the phase shifters 4A, 4B, 4C on a local and individual basis without changing the global phase coherence.

FIG. 2 illustrates trimming and optimisation of RF signals of the kind described above. In particular, for multiple signal paths, FIG. 2 illustrates that close and accurate control of the phases between the signal paths is important for effective trimming. Optimal heating efficiency in FIG. 2 is obtained at operating frequency $F_{opt}$ and relative phase $\phi_{opt}$ (this assumes two paths although, of course, the principal explained here may be extended to three or more paths).

Accurate control of the frequency to trim to $F_{opt}$ may be relatively easy to implement using PLLs under the control of a microcontroller. However, accurate control of the relative phase is much more difficult, because of the instantaneous nature of the phase: it is a delay between two signals at same frequency. At high frequencies, this delay can be as small as a few picoseconds for a couple of degrees.

U.S. Pat. No. 3,906,361 A describes a system for measuring the phase difference between two signals and having a digital readout. Each of the two signals are fed to Schmitt trigger circuits which convert the sine wave signals to square waves. The two square waves are compared for coincidence in a discriminator, the output thereof being converted by a logic circuit to a form for displaying the digital phase difference of the two signals U.S. Pat. No. 6,351,153 describes phase detector that detects the phase of two inputs with precision. Common errors due to temperature variations and supply voltage fluctuations are subtracted out. The phase detector and method utilize digital circuitry such as exclusive OR gates and differential amplifiers to perform the accurate phase detection. The inputs and outputs may be attenuated or filtered to produce the desired results.

WO 2013/156060 A1 describes a phase detector providing linear phase information from −180 DEG to +180 DEG. The phase detector comprises a frequency divider, a phase shifter and a mixer circuit. The frequency divider and phase shifter have an output port connected to an input port of the mixer circuit.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided a circuit for detecting the amount of phase shift applied to an RF signal to produce a phase shifted RF signal in an RF signal path, the circuit comprising:

a phase shifter operable to apply a phase shift to a reference signal to produce a phase shifted reference signal;

a phase detector operable to detect a phase difference between the phase shifted RF signal and the phase shifted reference signal, wherein the phase detector has a reduced input range at a frequency of the phase shifted RF signal compared to the input range of the phase detector at a frequency lower than the frequency of the phase shifted RF signal, and a controller operable to control the phase shifter to set the phase of the phase shifted reference signal so that the phase difference between the phase shifted RF signal and the phase shifted reference signal falls within the reduced input range of the phase detector.

According to another aspect of the invention, there can be provided a method of detecting the amount of phase shift applied to an RF signal to produce a phase shifted RF signal in an RF signal path, the method comprising:

receiving a reference signal and applying a phase shift to the reference signal to produce a phase shifted reference signal;

using a phase detector to detect a phase difference between the phase shifted RF signal and the phase shifted reference signal, wherein the phase detector has a reduced input range at a frequency of the phase shifted RF signal compared to the input range of the phase detector at a frequency lower than the frequency of the phase shifted RF signal, and setting the phase of the phase shifted reference signal so that the phase difference between the phase shifted RF signal and the phase shifted reference signal falls within the reduced input range of the phase detector.

Embodiments of this invention may allow accurate detection of the amount of phase shift applied to an RF signal in an RF signal path. At RF frequencies, phase detectors typically have a reduced input range within which a difference in phase at its inputs can accurately be measured. For example, the reduced input range of the phase detector may be bounded by an inaccurate zone within which the phase detector is unable to give an accurate measurement of the phase difference. According to embodiments of this invention, the phase of a reference signal can be set so that the phase difference between the phase shifted reference signal and the phase shifted RF signal falls within the reduced input range of the phase detector, whereby accurate phase measurements may be made. This may, for example, facilitate accurate trimming of the phases of the RF signals used to introduce RF radiation into the cavity of an RF heating apparatus.

In one embodiment, the controller may be operable to control a phase shifter of the RF signal path for applying an intended phase shift to the RF signal to produce the phase shifted RF signal. As noted above, the phase shift applied to the RF signal may, for example, be for the purposes of trimming the RF radiation introduced into the cavity of an RF heating apparatus. Due to process variations in the components of the signal path, the actual phase shift applied to the RF signal may not be equal to the intended phase shift. Embodiments of this invention can improve the accuracy with which the trimming can be achieved, as the amount of trim can accurately be determined. Thus, in one embodiment, the controller may be operable to control the phase shifter of the RF signal path to trim the phase shift applied to the RF signal to produce the phase shifted RF signal in accordance with the phase difference detected by the phase detector. In one embodiment, a respective phase shifter and phase detector can be used to determine the phase shift applied in each of a plurality of separate RF signal paths. In such embodiments, accurate trimming of the RF radiation produced by different antennae may be achieved.

In one embodiment, an output of the phase detector may be connected to an analogue to digital converter for producing a digital word representative of the detected phase difference. The digital word may be supplied to the controller. In this way, the controller may receive accurate, digitized, feedback as to the actual amount of phase shift that is applied to the RF signal in the signal path and may adjust its control of the signal paths accordingly.

In one embodiment the controller may be operable to control the phase shifter of the RF circuit to set the phase of the phase shifted reference signal in accordance with a number of factors. These may include:

the intended phase shift to be applied to the RF signal to produce the phase shifted RF signal;

the reduced input range of the phase detector at the frequency of the phase shifted RF signal.

These factors may be combined as described herein to determine an appropriate phase shift to apply to the reference signal for accurate detection of the phase shift applied in the signal path.

In one embodiment, the controller may make an initial estimate of the phase shift to be applied to produce the phase shifted reference signal. The initial estimate may be based on a measurement by the phase detector that falls outside the reduced input range of the phase detector. Subsequently, the controller can apply a phase shift to the reference signal to ensure that a later measurement is accurate.

In some embodiments, features can be provided for calibrating the phase detector. For example, the circuit may include a component for producing a pair of signals having a reference phase difference value. An example of such a component is a divider (e.g. a divider-by-2 can produce signals having a phase difference of 90°), provided the duty cycle of its input clock is 50%.

The controller may be operable to calibrate the phase detector by causing the pair of signals produced by the component (e.g. divider) to be applied to inputs of the phase detector. The controller may accordingly determine a reference output value of the phase detector at the reference phase difference (e.g. 90° in the case of a divider-by-2 as noted above). This reference output value of the phase detector can then be used to calibrate the phase detector, with the phase shifter of the RF signal path set to apply a phase shift to the RF signal corresponding to the reference phase difference value, iteratively adjusting the phase shift applied to the reference signal until the output of the phase detector corresponds to the reference output value.

In one embodiment, a phase locked loop can be used to produce the reference signal. In addition to being supplied to the phase shifter for producing the phase shifted reference signal, the reference signal may be used in the signal path for generating the RF signal. In cases where a plurality of RF signal paths are provided, a common phase locked loop may be used to provide the reference signal to each signal path and/or to each phase shifter.

According to a further aspect of the invention, there can be provided an RF heating apparatus comprising a circuit of the kind described above.

Embodiments of this invention may find application wherever phase monitoring is required. In the present disclosure, illustrative examples relating to an RF heating apparatus are provided. However, applications in integrated circuits for telecommunications (e.g. PLLs, DLLs), or in BIST circuits are also envisaged.

For the purposes of this application, RF frequencies are considered to be frequencies in the range 100 MHz≤f≤10 GHz. In some examples, frequencies falling within ISM bands may be used. These frequencies may find particular in given applications or fields. For instance the ISM band 433.05-434.790 MHz may be used for RF lighting applications and the ISM bands 902-928 MHz and 2.4-2.5 GHz may be used for RF heating applications.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Embodiments of this invention can provide a circuit for detecting the amount of phase shift applied to an RF signal. In particular, embodiments of this invention can allow detection of the amount of phase shift applied to an RF signal to produce a phase shifted RF signal in an RF signal path. An example of an application of this invention is in the field of RF heating, in which, as described above, it is beneficial to be able to trim the phase of the RF signals generated in one or more different signal paths to obtain optimal heating of a food or beverage located in the cavity of an RF heating apparatus. Nevertheless, other applications are envisaged (for example, as noted above in telecommunications e.g. PLLs, DLLs) or in BIST circuits and accordingly the present disclosure is not limited merely to RF heating.

Figure 1:
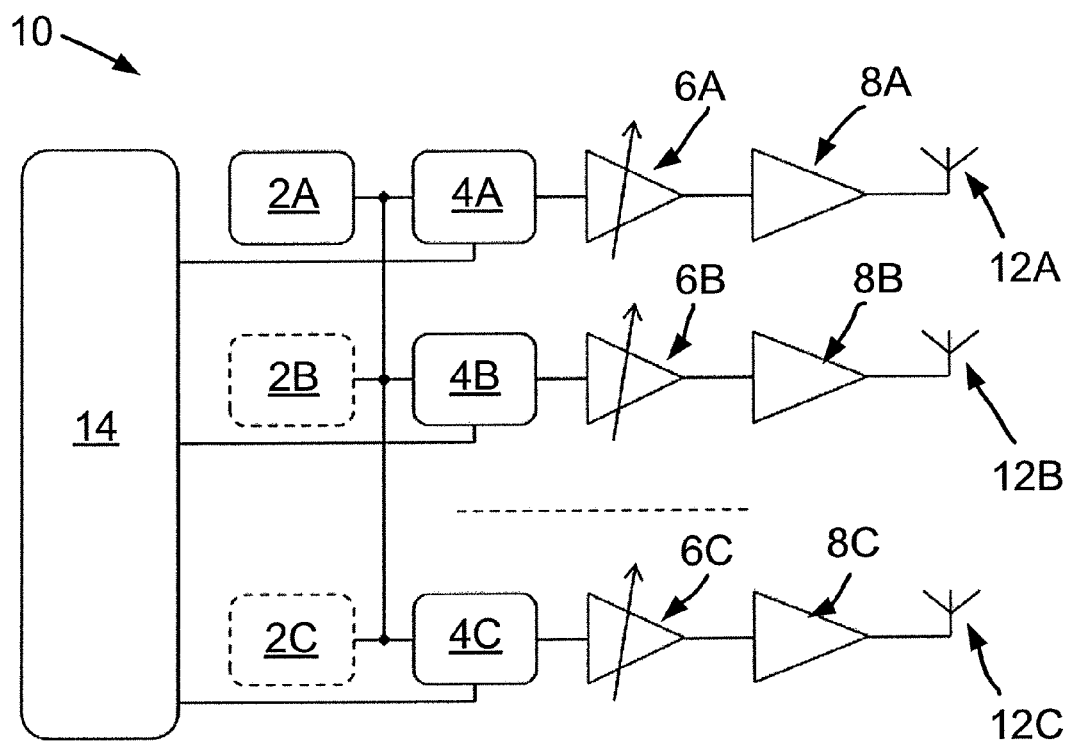
FIG. 1 shows a circuit for generating multi-phase signals for RF energy applications.
Figure 2:
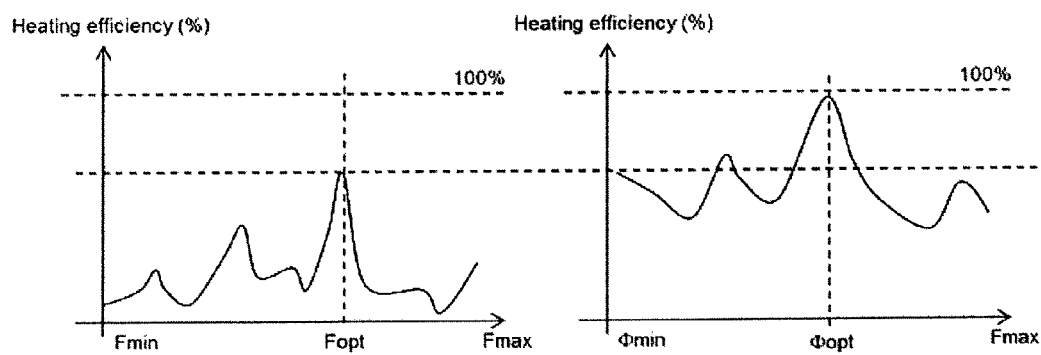
FIG. 2 shows the tuning of the frequency and phase of RF radiation introduced into a cavity of an RF heating apparatus for optimizing the heating efficiency of the apparatus.
Figure 3:
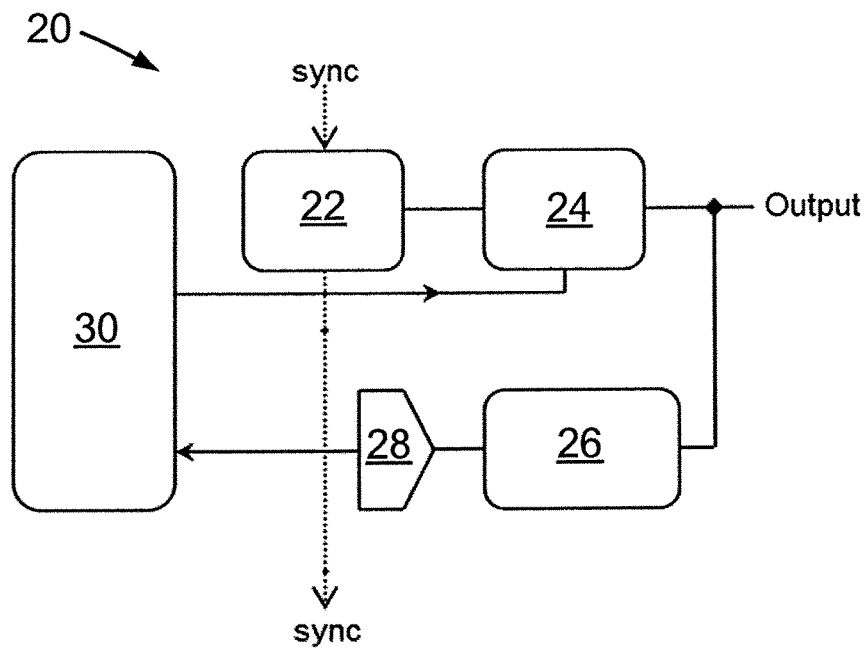
FIG. 3 shows a circuit for detecting the phase of an RF signal of an RF signal path in accordance with an embodiment of the invention.

A circuit 20 in accordance with a first embodiment of the present invention is shown in FIG. 3. In this example, the circuit 20 includes a signal path having a phase locked loop (PLL) 22 and a phase shifter 24. The PLL 22 receives a reference signal (indicated "sync" in FIG. 1) and uses it to produce an RF signal that is then passed to the phase shifter 24. The phase shifter 24 is controllable by a microcontroller 30 of the circuit 20 to apply, a desired or intended phase shift to the RF signal produced by the PLL 22. The phase shifted RF signal is then supplied to the output of the signal path. The output of the signal path may, for example, be connected to an antenna (normally via a one or more amplifiers such as variable gain or power amplifiers) for introducing RF radiation into the cavity of an RF heating apparatus.

As shown in FIG. 3, the reference signal received by the PLL 22 can also be passed on to other components of the circuit. For example, a common reference signal produced by the PLL 22, or received from an external component, can be passed on from the PLL 22 to the PLLs of other signal paths of the circuit 20. For simplicity, only a single signal path is illustrated in the example of FIG. 3, although it will be appreciated that any number of signal paths may be provided in accordance with the requirements of the particular application. Each signal path may similarly include a PLL and a phase shifter that is controllable by the microcontroller 30.

In the embodiment of FIG. 3, the circuit 20 is also provided with a phase detector 26. The phase detector is operable to detect a phase difference between the phase shifted RF signal produced by the phase shifter 24 and the reference signal. Accordingly, the reference signal used by the PLL 22 of the signal path can be provided as an input to the phase detector 26. In this way, the difference in phase between the reference signal and the shifted RF signal can be detected (for simplicity, the connection of the reference signal to the phase detector 26 is not illustrated in FIG. 3). The actual amount of phase shift applied to the RF signal by the phase shifter 24 can thus be detected, bearing in mind that this may differ from the intended amount.

In this example, the output of the phase detector 26 is provided to an analogue to digital converter (ADC) 28. In some examples, the ADC 28 can convert the output of the phase detector 26 into a digital word representative of the phase difference between the reference signal and the phase shifted RF signal produced by the phase shifter 24. In this example, the ADC 28 is connected to the microcontroller 30 and can thereby supply the digital word representative of the phase difference to the microcontroller 30.

The microcontroller 30 is, in some examples, operable to use the indications of phase difference detected by the phase detector 26 as feedback to determine an accurate reading as to the phase shift that has been applied by the phase shifter 24 under its control. Although the microcontroller 30 is connected to the phase shifter 24 and is able to control the amount of phase shift applied to the RF signal by the phase shifter 24, it will be appreciated that due to process and mismatch variations and factors such as temperature drift, it may in principal be difficult to provide close control of the applied phase shift unless an actual measurement of the phase shift is made. The purpose of the phase detector 26 is thus to allow such measurement and to allow the microcontroller 30 to receive accurate readings of the phase shift applied to the RF signal in the signal path so that it can implement close control of the applied phase shift.

Figure 5:
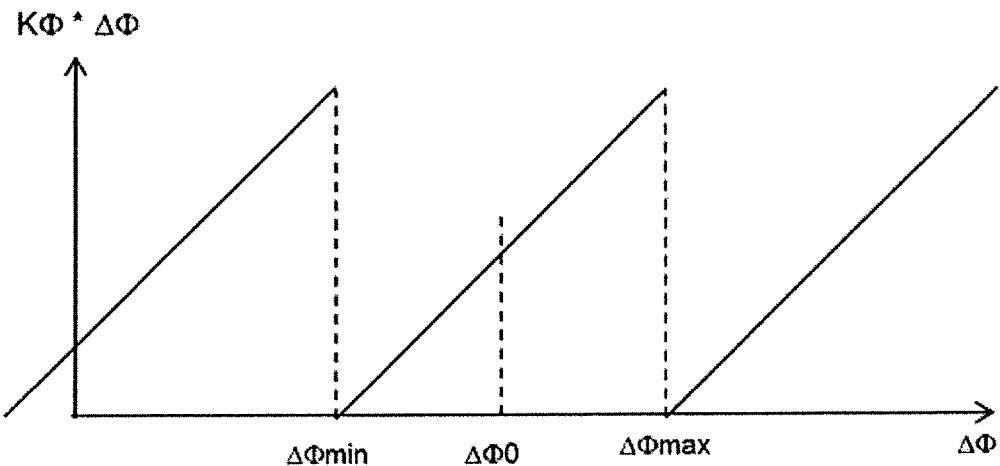
FIG. 5 shows an example of the response of a phase detector at low frequencies.
Figure 6:
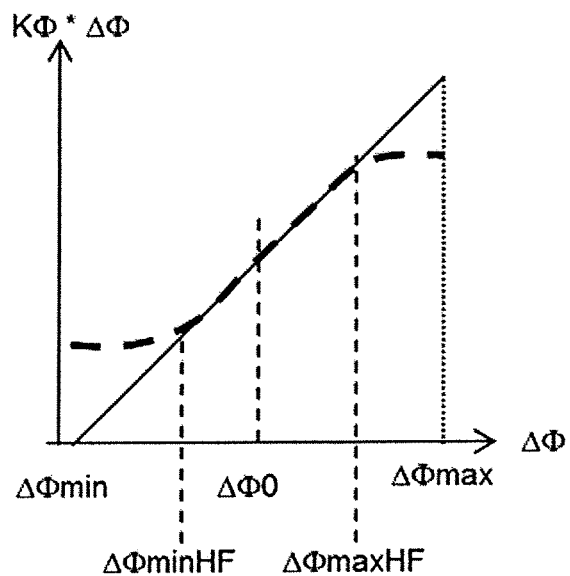
FIG. 6 shows an example of the response of a phase detector at high frequencies, demonstrating the reduced input range of the phase detector.

FIGS. 5 and 6 show the transfer function of a typical phase detector. In particular, FIG. 5 illustrates the transfer function of a phase detector at relatively low frequencies. As can be seen in FIG. 5, the transfer function comprises a saw tooth line shape with a linear output as a function of increasing phase difference between a minimum phase difference $\Delta\phi_{min}$ and a maximum phase difference $\Delta\phi_{max}$. A measurement of zero phase difference ($\Delta\phi_0$) yields an intermediate value, which is normally centred between the output values for $\Delta\phi_{min}$ and $\Delta\phi_{max}$. $\Delta\phi_{min}$ and $\Delta\phi_{max}$ may, for example, be 0 and $2\pi$, $-\pi$ and $\pi$ etc., depending on the particular type of phase detector being used.

At higher frequencies, such as at RF frequencies, the transfer function of a typical phase detector deviates from the ideal case shown in FIG. 5. This is illustrated in FIG. 6.

The dashed curve line in FIG. 6 illustrates that in certain regions (hereinafter referred to as inaccurate zones) the line shape of the transfer function deviates away from a linear line shape to the extent that accurate measurement of the phase difference at the inputs of the phase detector becomes difficult or impossible. The range over which the phase detector is still able to produce an accurate measurement of the phase difference at its inputs is referred to herein as the input range of the phase detector. As shown in FIG. 6, at high frequencies such as RF frequencies, a typical phase detector has a reduced input range. This reduced input range is indicated in FIG. 6 as extending between $\Delta\phi_{min}HF$ and $\Delta\phi_{max}HF$. Between $\Delta\phi_{min}HF$ and $\Delta\phi_{max}HF$ the response of the phase detector remains approximately linear so that the phase detector is still able to provide a reliable measurement of the phase difference at its input. However, below $\Delta\phi_{min}HF$ and above $\Delta\phi_{max}HF$, the linearity of the phase detector response is lost, so that accurate measurement of the phase at its inputs is no longer possible.

With reference again to FIG. 3, it will be appreciated that at RF frequencies, the phase detector 26 may in some cases not be able to provide an accurate determination of the phase difference between the phase shifted RF signal and the reference signal. In particular, the phase difference may fall outside the reduced input range of the phase detector 26 at RF frequencies. Embodiments of this invention can allow accurate determination of the phase shift applied to an RF signal in an RF signal path, even though the frequency of an RF signal is typically rather high. This will be explained in more detail below.

Figure 4:
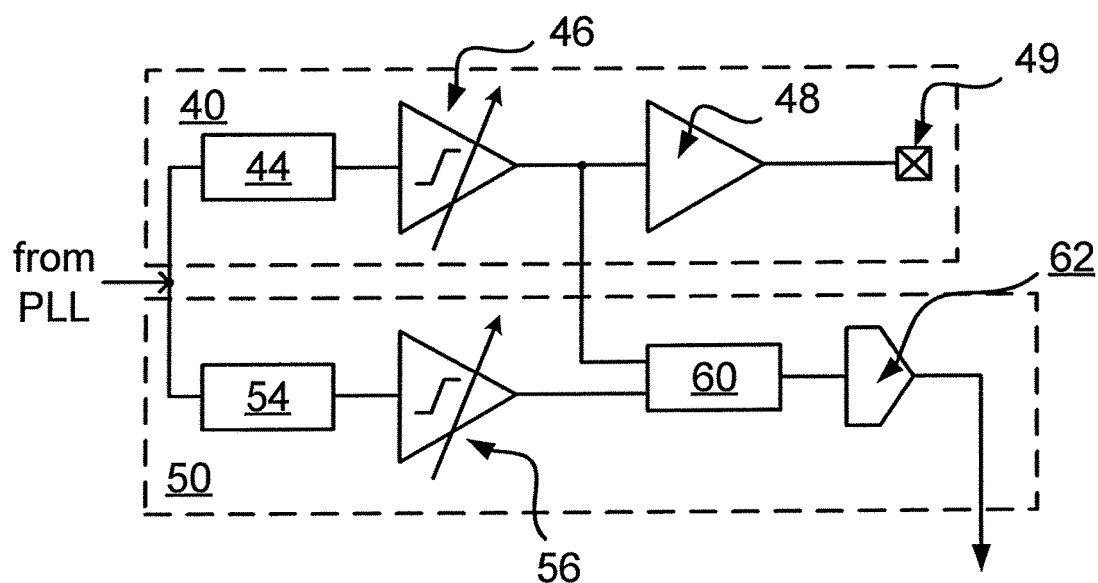
FIG. 4 shows a circuit for detecting the phase of an RF signal of an RF signal path in accordance with an embodiment of the invention.

FIG. 4 illustrates a circuit in accordance with another embodiment of this invention. The circuit in FIG. 4 includes a signal path 40 and a reference path 50, the components of which are delineated in FIG. 4 by the dashed boxes.

In FIG. 4, both the signal path 40 and the reference path 50 include respective phase shifters 44 and 54. The phase shifters 44 and 54 both receive an input signal from a PLL (not shown in FIG. 4). The signal path 40 and the reference path also both include respective variable gain amplifiers 46, 56. The signal path 40 further includes an output buffer 48. An output 49 of the signal path 40 may, for example, be connected to the antenna of an RF heating apparatus.

The circuit may further include a controller such as a microcontroller as explained above in relation to FIG. 3. The controller may be connected to the phase shifters 44 and 54 and the variable gain amplifiers 46 and 56 so that control signals may be applied for operating these components.

The reference path 50 in this example further includes a phase detector 60. The phase detector 60 has an output that is supplied to an ADC 62 in an arrangement similar to that described above in relation to FIG. 3. Thus, the output of the ADC 62 can be supplied to the controller as indicated by the arrow at the output of component 62 in order that the phase difference detected by the phase detector 60 can be supplied as a signal comprising, for example, a digital word. The controller can thus receive feedback as to the amount of phase shift being applied by the phase shifter 44 in the signal path 40.

A first input of the phase detector 60 is connected to the RF signal path 40. For example, the phase detector 60 may be connected to the output of the phase shifter 44. In the present embodiment, the phase detector 60 is connected to the output of the variable gain amplifier 46 so that any static phase shift applied by the variable gain amplifier 46 can be included in the phase difference detected by the phase detector 60. Similarly, the other input of the phase detector 60 is connected to the output of the variable gain amplifier 56 of the reference path 50.

In this embodiment, the purpose of the phase shifter 54 is to apply a phase shift to the reference signal received from the PLL (which, as explained above, is also received by the phase shifter 44) in order to ensure that the difference in phase detected at the inputs of the phase detector 60 falls within the reduced input range of the phase detector 60 at the frequency of the RF signal. This will be explained in more detail below in relation to FIGS. 7 and 8.

The phase diagrams in FIG. 7 illustrate how the effective input range of a phase detector at high frequencies can be increased by offsetting the position of the reduced input range of the phase detector. In particular and with reference to FIG. 4, the phase shifter 54 in the reference path 50 can, in accordance with an embodiment of this invention, apply a phase shift to the signal received from the PLL so that the phase shift detected at the input of the phase detector 60 remains within the reduced input range of the phase detector 60, even at high frequencies.

Figures 7A, 7B, 7C, 7D:
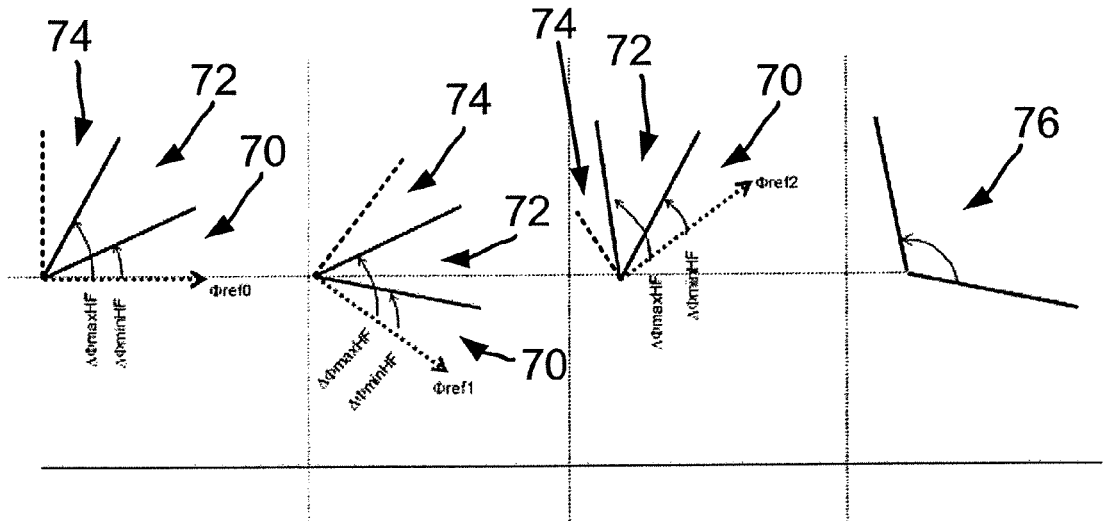
FIGS. 7A to 7D show the effect of shifting a reference frequency received from the signal path for effectively extending the input range of the phase detector in accordance with an embodiment of the invention.

In FIG. 7A, no phase shift is applied by the phase shifter 54 ($\phi_{ref0}=0$). Referring again to FIG. 6, and comparing this with FIG. 7A, it will be seen that there exists a reduced input range 72 of the phase detector which is bounded on either side by an inaccurate zone. The inaccurate zone has two parts. With $\phi_{ref0}=0$, a first part 70 of the inaccurate zone ranges from a phase difference of zero to $\Delta\phi_{min}HF$. A second part 74 of the inaccurate zone ranges from $\Delta\phi_{max}HF$ to $\Delta\phi_{max}$. With $\phi_{ref0}=0$, the phase detector 60 is thus able to provide accurate detection of phase between $\Delta\phi_{min}HF$ and $\Delta\phi_{max}HF$. By introducing a phase shift by the phase shifter 54 however, the accurate range of detection of the phase detector 60 can be shifted so that phase differences that fall outside the reduced input range 72 in FIG. 7A can also be detected.

In FIG. 7B, it is shown that a phase shift of $\phi_{ref1}=-\Delta\phi_{min}HF$ is applied by the phase shifter 54. This has the effect of shifting the reduced input range 72 of the phase shifter to lower phase differences. The inaccurate zones 70 and 74 are also shifted to lower phase differences.

Referring now to FIG. 7C, it is shown that a phase difference $\phi_{ref2}=\Delta\phi_{max}HF-\Delta\phi_{min}HF$ is applied by the phase shifter 54. This has the effect of shifting the reduced input range 72 of the phase detector to higher phase differences. Similarly, the inaccurate zones 70 and 74 are also shifted to higher phase differences.

FIG. 7D shows the coverage 76 of the phase detector using the technique described above in relation to FIGS. 7A, 7B and 7C. It can be seen that by shifting one input of the phase detector to a higher or lower phase, the reduced input range 72 of the phase detector can be moved to higher and lower phase differences, thereby increasing the effective range of phase differences detectable by the phase detector.

Although in the example described here in relation to FIG. 7, the particular reference phases $\phi_{ref0}=0$, $\phi_{ref1}=-\Delta\Delta\phi_{min}HF$ and $\phi_{ref2}=\Delta\phi_{max}HF-\Delta\phi_{min}HF$ were used for illustrative purposes to demonstrate the increased coverage 76, it will be appreciated that the phase shift applied by the phase shifter 54 can in principle be set to any particular level required to ensure that the phase difference detected at the inputs of the phase detector 60 shown in FIG. 4 falls within its reduced input range. Typically, the amount of phase shift applied by the phase shifter 54 of the reference path 50 can be determined in accordance with a number of factors.

Firstly, during the operation of the circuit, the controller 30 will have knowledge of the intended amount of phase shift to be applied to the RF signal in the RF signal path and will send corresponding control signals to the phase shifter 44 in the signal path 40. As noted above, it will be appreciated that the actual phase shift applied by the phase shifter 44 in accordance with these control signals may not be exactly equal to the intended amount of phase shift for reasons such as process variability and temperature drift. Nevertheless, the intended amount of phase shift to be applied to the RF signal can provide a first approximation of the amount of phase shift that should be applied by the phase shifter 54 in the reference path 50.

Secondly, the reduced input range of the phase detector 60 at the operating frequencies of the circuit will be typically known from the manufacturers' specifications. Therefore, the values $\Delta\phi_{min}HF$, $\Delta\phi_{min}HF$ will be known.

A third factor to be included in the calculation may be a calibrated reference phase difference, which will be described in more detail below in relation to FIGS. 9 and 10.

Using the factors mentioned above, the appropriate amount of phase shift to be applied in the reference path 50 by the phase shifter 54 can be determined so that the difference in phase between the phase shifted RF signal in the signal path and the phase shifted reference signal in the reference path falls within the reduced input range of the phase detector.

In one embodiment, an initial measurement by the phase detector 60, with the phase shifter 54 set to apply a zero phase shift ($\phi_{ref}=0$) to the reference signal can be used as a first approximate indication of the phase shift that should subsequently be applied by the phase shifter 54 for accurate measurement of the phase shift applied to the RF signal in the signal path. An example of this is described below with reference to FIG. 8.

Figure 8:
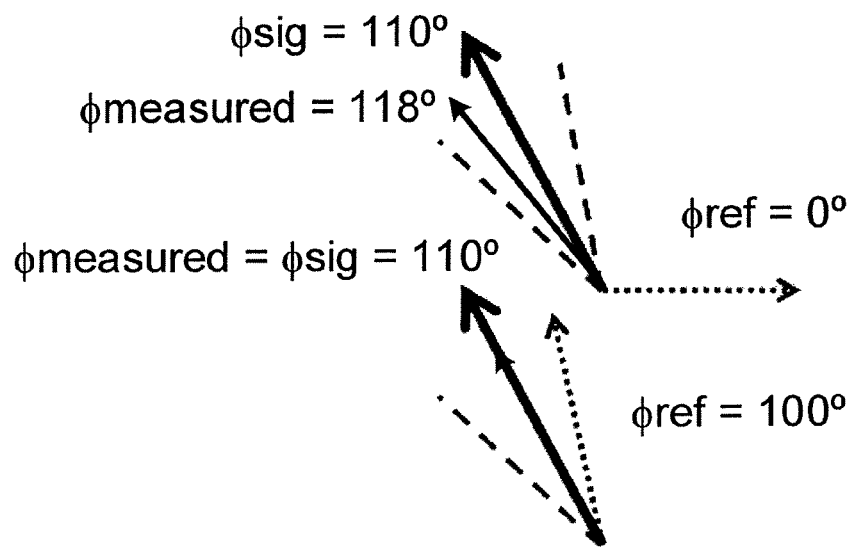
FIG. 8 illustrates making a determination as to an appropriate offset to apply to the reference signal for accurate measurement of the phase of an RF signal in accordance with an embodiment of the invention.

In FIG. 8, it is assumed that the actual amount of phase shift applied to the RF signal in the RF signal path 40 by the phase shifter 44 is $\phi_{sig}=110°$. In a first measurement by phase detector 60, with the phase shifter 54 set to apply a zero phase shift to the reference signal, it is assumed that the value of $\phi_{sig}$ falls above the reduced input range 72 of the phase detector 60 ($\phi_{sig}>\Delta\phi_{max}HF$). In the first measurement of phase by the phase detector 60 shown in the upper portion of FIG. 8, the phase detector would typically therefore make an inaccurate measurement of the phase difference. For the sake of this example, it is assumed that the measured value is $\phi_{measured}=118°$.

Although this measurement is known to be inaccurate, it does provide useful information as it provides an approximation as to where the true phase shift applied by the phase shifter 44 lies. Using the value of 118° measured in the first measurement of FIG. 8, and knowing the approximate widths and positions of the boundaries between the inaccurate and accurate zones of the phase detector (see FIG. 7), the controller in this example sets the phase shifter 54 to apply a phase shift of $\phi_{ref}=100°$ to the reference signal. This is shown schematically in the second phase diagram in FIG. 8. This shift in phase moves the reduced input range 72 of the phase detector 60 so that the likely true value of phase shift applied by the phase shifter 44 (which, again is known to be in the vicinity of 118°) falls within the reduced input range 72. Thus in the second measurement made in the second phase diagram of FIG. 8, with $\phi_{ref}=100°$, $\phi_{sig}$ is consequently measured accurately at 110° ($\phi_{measured}=\phi_{sig}=100°$).

It will be appreciated that this invention is applicable to different kinds of phase detector. Phase detectors of different kinds have different transfer function but the principle of shifting the phase of one of the inputs of the phase detector so that an anticipated phase shift to be detected falls within an accurate range of the phased defector may be applied to phase detectors having transfer functions that are not necessarily the same as that described in relation to FIGS. 5 and 6. In one example, the phase detector is a balanced XOR phase detector as is well known in the art. However, other well-known kinds of phase detector can also be used (for example, three state phase detectors or phase detectors based on RS flip flops).

In order to use the phase detector 60 for accurate determination of the phase difference at its inputs, and in accordance with an embodiment of this invention, features can be provided for calibrating the phase detector 60 in order to determine at least one point of the transfer function of the phase detector that can be trusted. These features and a method for calibrating the phase detector 60 will now be described in relation to FIGS. 9 and 10.

In general, a phase difference of 90° at the inputs of a phase detector produces a very well controlled, balanced output. In practice, a phase difference of 90° often falls at or near the exact middle of $\Delta\phi_{min}HF$ and $\Delta\phi_{max}HF$, but it is acknowledged that depending on the implementation at transistor level, there may be some unbalance. Moreover, other features of the circuit, such as the ADCs 28, 62 described above in relation to FIGS. 3 and 4 may have some process dependency even if they are generally well matched. Because of these factors, the absolute value of phase indicated by the output of a phase detector such as the phase detector 60 shown in FIG. 4 generally cannot be trusted. Because of this, even if the phase difference at the inputs of the phase detector 60 shown in FIG. 4 falls within the reduced input range of the phase detector 60, an accurate determination of the phase shift applied to the RF signal in the RF signal path 50 may not be possible.

Figure 9:
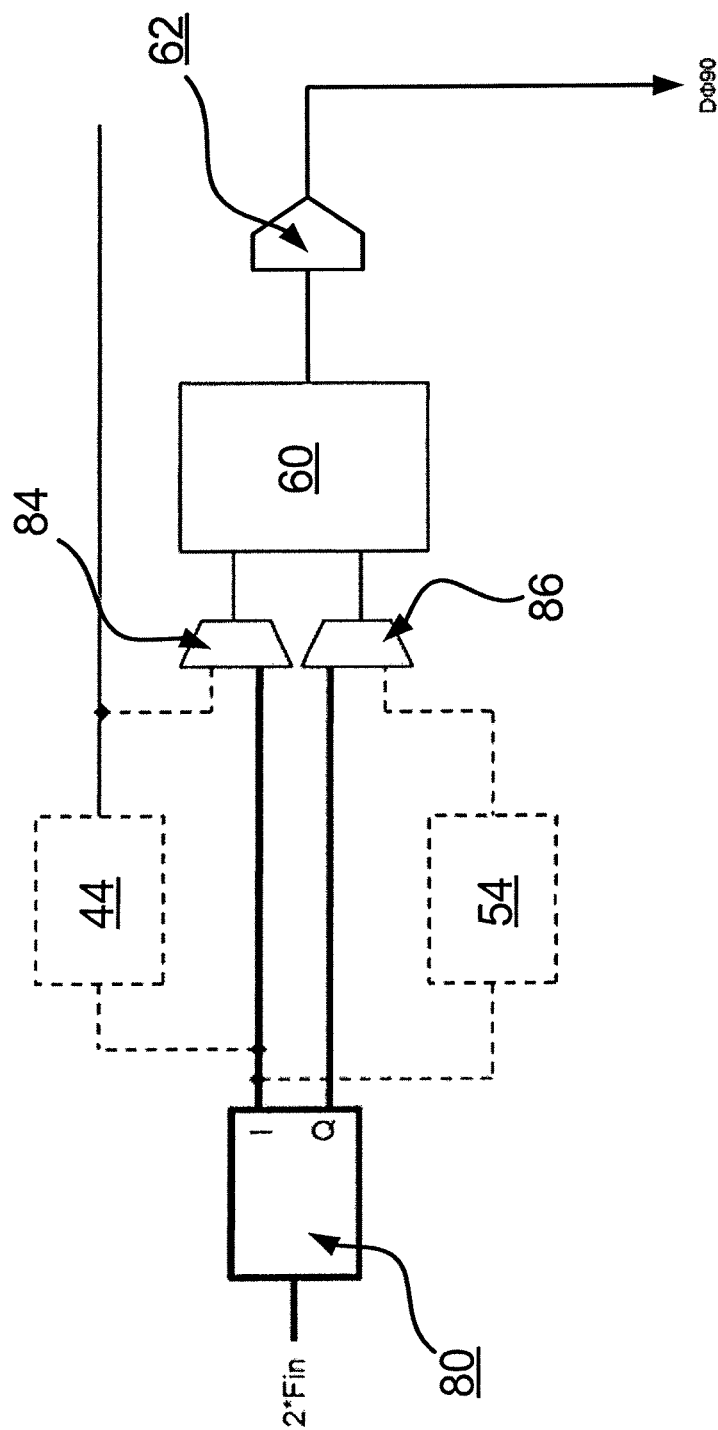
FIGS. 9 and 10 show a circuit for detecting the phase of an RF signal of an RF signal path in accordance with an embodiment of the invention, the circuit including components for calibrating the phase detector of the circuit.
Figure 10:
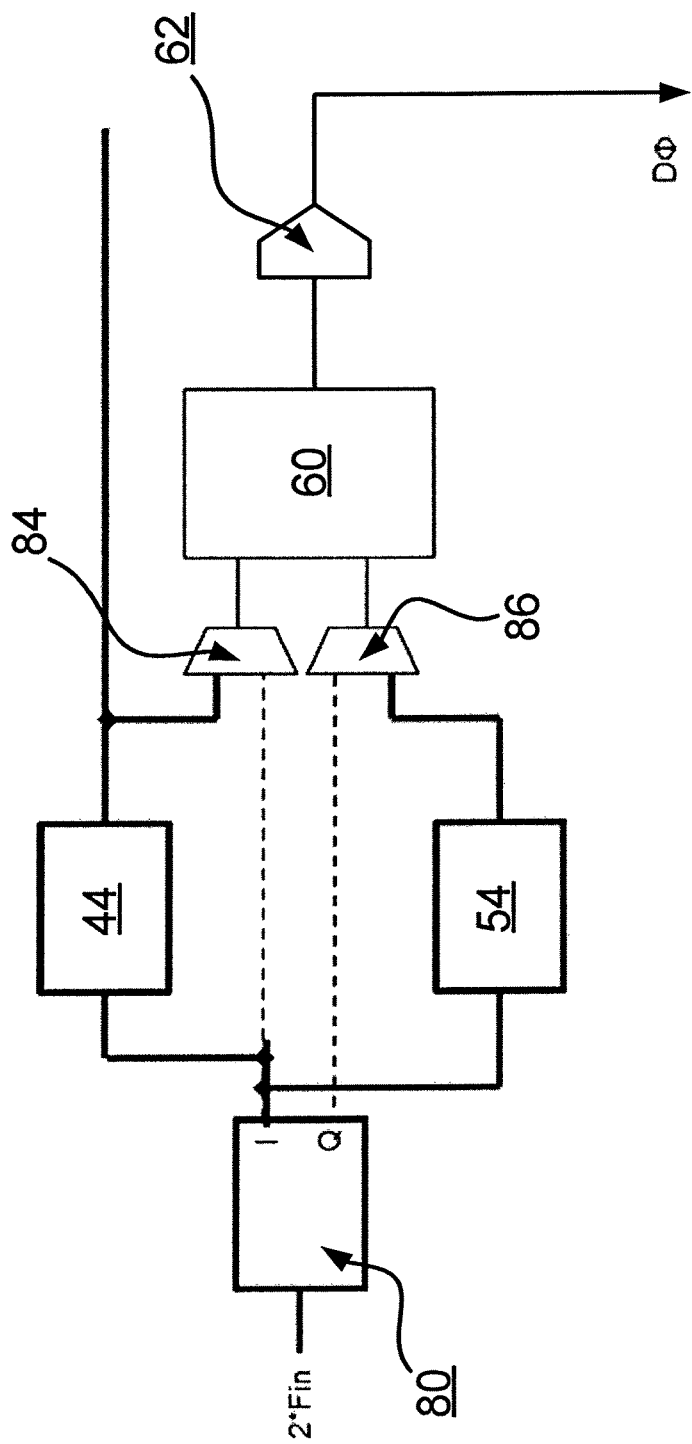

FIGS. 9 and 10 illustrate the provision of further features in a circuit in accordance with an embodiment of this invention to allow the phase detector to be properly calibrated. FIGS. 9 and 10 are also illustrative of the calibration method that can be used.

Firstly, in FIG. 9, multiplexers 84 and 86 are used to apply the output of a component 80 to the inputs of the phase detector 60. The component 80 produces a pair of signals that have a known phase difference. In one example, the component 80 is a divider-by-2 which, as is well known in the art, produces outputs I and Q having a phase difference of exactly 90°. It will be appreciated that a component 80 other than a divider-by-2 may be used. In principal, any component that produces a pair of signals having a well-defined and accurately determined phase difference may be used. Provided it is possible to robustly generate its input clock (running at twice its output frequency), a divider-by-2 is a convenient choice for the purposes of calibrating a phase detector of the kind described herein because a 90° phase difference generally produces a well balanced, well defined phase detector output as noted above.

The multiplexers 84, 86 can be controlled by a microcontroller of the circuit (not shown in FIGS. 9 and 10), which can also control the various other features of the circuit to run the calibration routine of this embodiment.

With the outputs I and Q of the component 80 applied to the inputs of the phase detector 60, the output of the phase detector 60 is supplied to an ADC 62 which produces a digital word. The digital word, which corresponds to a phase difference at the inputs of the phase detector of exactly 90° and which is denoted in the Figures by D$\phi$90 can be provided to the controller.

In a next step of the calibration routine shown in FIG. 10, the component 80 is disconnected from the inputs of the phase detector 60 by the multiplexers 84 and 86. The inputs of the phase detectors 60 are now connected by the multiplexers 84 and 86 to the phase shifter 44 of the signal path and the phase shifter 54 of the reference path as described above. Under the control of the microcontroller, the phase shift applied by the phase shifter 44 in the signal path is now set to the reference phase difference of the component 80. For example, here the component 80 comprises a divider-by-2 producing signals having a phase difference of 90°. Thus, in the present example, the controller programs the phase shifter 44 to apply a 90° phase shift to the RF signal in the signal path. For the reasons noted above (process variation, temperature drift etc.) it will be appreciated that the exact phase shift applied by the phase shifter 44 may not be exactly 90°.

Having programmed the phase shifter 44, the controller can now adjust the phase shift applied by the phase shifter 54 of the reference path until the digital word for D$\phi$90. If the digital word produced by the ADC 62 represents a phase difference larger than 90° then the phase shift applied by the phase shifter 54 is reduced. Conversely, if the digital word produced by the ADC 62 is representative of a phase difference that is smaller 90° then the phase shift applied by the phase shifter 54 is increased. This exercise can be repeated iteratively until a phase shift applied by the phase shifter 54 produces the digital word for D$\phi$90. The value of phase shift applied by phase shifter 54 to produce the digital word D$\phi$90, with the phase shifter 44 set to 90°, can be used as a trusted reference point so that future measurements of phase by the phase detector can be relied upon. The value can be stored by the controller.

After the calibration routine described above, and provided the phase detector is substantially linear between $\Delta\phi_{min}$HF and $\Delta\phi_{max}$HF, the output of the phase detector 60, for example, the digital word produced by the ADC 62 will provide an exact measurement of the phase difference between the phase shifted RF signal in the signal path and the phase shifted reference signal. This measurement can be used to provide an exact determination as to the actual amount of phase shift applied to the RF signal in the RF signal path by the phase shifter 44. This information can be used by the controller to allow for close control of the phase of the RF signal.

The calibration method noted above includes a single calibration point at 90°. However, it is envisaged that multiple calibration points could be used for a more accurate calibration. In such cases, it would be necessary to provide pairs of signals having known phase differences between them, each pair of signals having a known phase difference corresponding to one of the calibration points.

Examples of suitable ADCs that can be used to implement the invention include SAR ADCs, Flash ADCs or pipelined ADCs. The number of bits provided by the ADC can be chosen in accordance with the required accuracy of the circuit.

It will be appreciated that in the embodiments described above, for simplicity and for illustrative purposes, only a single RF signal path has been described. Nevertheless, it is envisaged that an RF circuit having multiple RF signal paths, each signal being provided with a reference path of the kind described above in relation to FIG. 4, can be provided. Each reference path may include features such as a phase shifter 54 and a phase detector 60 and ADC 62 for determining the phase trim applied by a phase shifter in each respective RF signal path could be implemented in accordance with an embodiment of this invention. In this way, the phase shift applied in multiple different signal paths could be determined and fed back to the controller of the circuit in order that close control of the phase shift applied in each signal path can be achieved.

Accordingly, there has been described an RF circuit and method for detecting the amount of phase shift applied to an RF signal. An RF heating apparatus including the RF circuit. The RF circuit includes a phase shifter operable to apply a phase shift to a reference signal to produce a phase shifted reference signal. The RF circuit also includes a phase detector operable to detect a phase difference between the phase shifted RF signal and the phase shifted reference signal. The phase detector has a reduced input range at a frequency of the phase shifted RF signal. The RF circuit further includes a controller operable to control the phase shifter to set the phase of the phase shifted reference signal so that the phase difference between the phase shifted RF signal and the phase shifted reference signal falls within the reduced input range of the phase detector.

Although particular embodiments of the invention have been described, it will be appreciated that many modifications/additions and/or substitutions may be made within the scope of the claimed invention.

The invention claimed is:

1. A circuit for detecting an amount of phase shift applied to an RF signal to produce a phase shifted RF signal in an RF signal path, the circuit comprising:
   a phase shifter operable to apply a phase shift to a reference signal to produce a phase shifted reference signal;
   a phase detector operable to detect a phase difference between the phase shifted RF signal and the phase shifted reference signal, wherein the phase detector has a reduced input range at a frequency of the phase shifted RF signal compared to an input range of the phase detector at a frequency lower than the frequency of the phase shifted RF signal, and
   a controller operable to control the phase shifter to set the phase shift of the phase shifted reference signal so that the phase difference between the phase shifted RF signal and the phase shifted reference signal falls within the reduced input range of the phase detector.

2. The circuit of claim 1, wherein the controller is operable to:
   control a phase shifter of the RF signal path for applying an intended phase shift applied to the RF signal to produce the phase shifted RF signal.

3. The circuit of claim 2, wherein the controller is operable to
   control the phase shifter of the RF signal path to trim the phase shift applied to the RF signal to produce the phase shifted RF signal in accordance with the phase difference detected by the phase detector.

4. The circuit of claim 3,
wherein an output of the phase detector is connected to an analogue to digital converter for producing a digital word representative of the detected phase difference, and
wherein the analogue to digital converter is operable to supply the digital word to the controller.

5. The circuit of claim 2, wherein the controller is operable to:
control the phase shifter of the RF circuit to set the phase of the phase shifted reference signal in accordance with:
the intended phase shift to be applied to the RF signal to produce the phase shifted RF signal; and/or
the reduced input range of the phase detector at the frequency of the phase shifted RF signal.

6. The circuit of claim 1,
wherein the controller is operable to make an initial estimate of the phase shift to be applied to produce the phase shifted reference signal based on a measurement by the phase detector that falls outside the reduced input range of the phase detector.

7. The circuit of claim 1, comprising
a component for producing a pair of signals having a phase difference that falls within the reduced input range of the phase detector for calibrating the phase detector.

8. The circuit of claim 7, wherein the controller is operable to calibrate the phase detector by:
causing the pair of signals to be applied to inputs of the phase detector; and
determining the output of the phase detector at the reference phase difference.

9. The circuit of claim 8, wherein the controller is further operable to calibrate the phase detector by:
controlling the phase shifter of the RF signal path to apply a phase shift to the RF signal corresponding to the reference phase difference value; and
iteratively controlling the phase shifter of the RF circuit to adjust the phase difference it applies to the reference signal until the output of the phase detector corresponds to the output of the phase detector determined while the pair of signals were applied to inputs of the phase detector.

10. The circuit of claim 1,
wherein the reduced input range of the phase detector is bounded by an inaccurate zone in which the phase detector is unable to give an accurate measurement of the phase difference between the phase shifted RF signal and the phase shifted reference signal.

11. The circuit of claim 1,
wherein the reference signal is used in the signal path for generating the RF signal.

12. The circuit of claim 1,
for detecting the amount of phase shift applied to a plurality of RF signals to produce a plurality of phase shifted RF signals in a plurality of RF signal paths, the RF circuit comprising, for each respective RF signal path:
a phase shifter operable to apply a phase shift to a reference signal to produce a phase shifted reference signal; and
a phase detector operable to detect a phase difference between the phase shifted RF signal of the respective signal path and the phase shifted reference signal, wherein the phase detector has a reduced input range at a frequency of the phase shifted RF signal compared to the input range of the phase detector at a frequency lower than the frequency of the phase shifted RF signal,
wherein the controller is operable to control each phase shifter to set the phase of each phase shifted reference signal so that the phase difference between the phase shifted RF signal of each signal path and each respective phase shifted reference signal falls within the reduced input range of each respective phase detector.

13. The circuit of claim 1:
wherein the circuit is embedded in an RF heating apparatus.

14. A method of detecting an amount of phase shift applied to an RF signal to produce a phase shifted RF signal in an RF signal path, the method comprising:
receiving a reference signal and applying a phase shift to the reference signal to produce a phase shifted reference signal;
using a phase detector to detect a phase difference between the phase shifted RF signal and the phase shifted reference signal, wherein the phase detector has a reduced input range at a frequency of the phase shifted RF signal compared to an input range of the phase detector at a frequency lower than the frequency of the phase shifted RF signal, and
setting the phase of the phase shifted reference signal so that the phase difference between the phase shifted RF signal and the phase shifted reference signal falls within the reduced input range of the phase detector.

15. The method of claim 14, further comprising calibrating the phase detector by:
determining the output of the phase detector when signals having a known reference phase difference are applied to inputs of the phase detector;
controlling a phase shifter of the RF signal path to apply a phase shift to the RF signal corresponding to the reference phase difference; and
iteratively adjusting the phase difference applied to the reference signal until the output of the phase detector corresponds to the output of the phase detector determined while the signals having the known reference phase difference were applied to the inputs of the phase detector.

* * * * *